(12) United States Patent
Gao et al.

(10) Patent No.: US 11,171,117 B2
(45) Date of Patent: Nov. 9, 2021

(54) INTERLAYER CONNECTION OF STACKED MICROELECTRONIC COMPONENTS

(71) Applicant: Invensas Bonding Technologies, Inc., San Jose, CA (US)

(72) Inventors: Guilian Gao, San Jose, CA (US); Belgacem Haba, Saratoga, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 16/438,714

(22) Filed: Jun. 12, 2019

(65) Prior Publication Data

US 2019/0378820 A1 Dec. 12, 2019

Related U.S. Application Data

(60) Provisional application No. 62/683,857, filed on Jun. 12, 2018.

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/76898* (2013.01); *H01L 23/481* (2013.01); *H01L 24/03* (2013.01); *H01L 24/05* (2013.01); *H01L 24/08* (2013.01); *H01L 24/89* (2013.01); *H01L 24/92* (2013.01); *H01L 25/50* (2013.01);
(Continued)

(58) Field of Classification Search
CPC ............... H01L 25/0657; H01L 25/50; H01L 21/76898; H01L 24/05; H01L 24/08; H01L 24/94; H01L 2224/08146; H01L 2224/05552; H01L 2224/80894; H01L 2224/80896; H01L 2224/94;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013-33786 A 2/2013
JP 2018-160519 A 10/2018
(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Mohammed Shamsuzzaman
*Assistant Examiner* — Aaron J Gray

(57) ABSTRACT

Representative techniques and devices including process steps may be employed to form a common interconnection of a multi-die or multi-wafer stack. Each device of the stack includes a conductive pad disposed at a predetermined relative position on a surface of the device. The devices are stacked to vertically align the conductive pads. A through-silicon via is formed that electrically couples the conductive pads of each device of the stack.

14 Claims, 5 Drawing Sheets

(51) Int. Cl.
*H01L 23/48* (2006.01)
*H01L 25/00* (2006.01)
*H01L 23/00* (2006.01)

(52) U.S. Cl.
CPC .... *H01L 24/94* (2013.01); *H01L 2224/03616* (2013.01); *H01L 2224/0557* (2013.01); *H01L 2224/05552* (2013.01); *H01L 2224/05647* (2013.01); *H01L 2224/08146* (2013.01); *H01L 2224/80895* (2013.01); *H01L 2224/80896* (2013.01); *H01L 2225/06544* (2013.01); *H01L 2225/06562* (2013.01)

(58) Field of Classification Search
CPC ......... H01L 2225/06544; H01L 23/481; H01L 2225/06562
See application file for complete search history.

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 9,093,350 | B2 | 7/2015 | Endo et al. |
| 9,142,517 | B2 | 9/2015 | Liu |
| 9,171,756 | B2 | 10/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,337,235 | B2 | 5/2016 | Chen et al. |
| 9,394,161 | B2 | 7/2016 | Cheng et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,799,587 | B2 | 10/2017 | Fujii et al. |
| 9,893,004 | B2 | 2/2018 | Yazdani |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,026,605 | B2 | 7/2018 | Doub et al. |
| 10,075,657 | B2 | 9/2018 | Fahim et al. |
| 10,269,756 | B2 | 4/2019 | Uzoh |
| 10,276,619 | B2 | 4/2019 | Kao et al. |
| 2004/0084414 | A1 | 5/2004 | Sakai et al. |
| 2006/0057945 | A1 | 3/2006 | Hsu et al. |
| 2007/0037379 | A1* | 2/2007 | Enquist ............. H01L 21/76838 438/618 |
| 2007/0111386 | A1 | 5/2007 | Kim et al. |
| 2011/0108972 | A1* | 5/2011 | Foster, Sr. .......... H01L 25/0657 257/686 |
| 2014/0175655 | A1 | 6/2014 | Chen et al. |
| 2014/0206145 | A1 | 7/2014 | Fay et al. |
| 2014/0342502 | A1 | 11/2014 | Ma et al. |
| 2015/0029774 | A1 | 1/2015 | Keeth |
| 2015/0064498 | A1 | 3/2015 | Tong |
| 2015/0357310 | A1* | 12/2015 | Kim .................. H01L 24/92 257/774 |
| 2016/0343682 | A1 | 11/2016 | Kawasaki |
| 2017/0005000 | A1* | 1/2017 | Beyne ............... H01L 21/76898 |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0219038 | A1 | 8/2018 | Gambino et al. |
| 2018/0323177 | A1 | 11/2018 | Yu et al. |
| 2018/0323227 | A1 | 11/2018 | Zhang et al. |
| 2018/0331066 | A1 | 11/2018 | Uzoh et al. |
| 2019/0115277 | A1 | 4/2019 | Yu et al. |
| 2019/0131277 | A1 | 5/2019 | Yang et al. |
| 2020/0273844 | A1* | 8/2020 | Hirano .................... H01L 25/50 |

FOREIGN PATENT DOCUMENTS

KR 10-2017-0021070 A 2/2017
WO 2005-043584 A2 5/2005

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.
Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.
Plobi et al., "Wafer Direct Bonding: Tailoring Adhesion Between Brittle Materials," Materials Science and Engineering Review Journal, 1999, 88 pages.
International Search Report and Written Opinion for PCT/US2019/036741, dated Sep. 27, 2019, 15 pages.

* cited by examiner

INTERLAYER CONNECTION OF STACKED MICROELECTRONIC COMPONENTS

PRIORITY CLAIM AND CROSS-REFERENCE TO RELATED APPLICATION

This application claims the benefit under 35 U.S.C. § 119(e)(1) of U.S. Provisional Application No. 62/683,857, filed Jun. 12, 2018, which is hereby incorporated by reference in its entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The bonding includes a spontaneous process that takes place at ambient conditions when two prepared surfaces are brought together (see for example, U.S. Pat. Nos. 6,864,585 and 7,485,968, which are incorporated herein in their entirety).

Respective mating surfaces of the bonded dies or wafers often include embedded conductive interconnect structures (which may be metal), or the like. In some examples, the bonding surfaces are arranged and aligned so that the conductive interconnect structures from the respective surfaces are joined during the bonding. The joined interconnect structures form continuous conductive interconnects (for signals, power, etc.) between stacked dies or wafers.

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology (i.e., nanometer scale variance), so that the surfaces can be closely mated to form a lasting bond.

Double-sided dies can be formed and prepared for stacking and bonding, where both sides of the dies will be bonded to other substrates or dies, such as with multiple die-to-die or die-to-wafer applications. Preparing both sides of the die includes finishing both surfaces to meet dielectric roughness specifications and metallic layer (e.g., copper, etc.) recess specifications. The bonding surfaces may be prepared for bonding with another die, wafer, or other substrate using a chemical mechanical polishing (CMP) process, or the like.

Regarding multiple die-to-die or die-to-wafer stacks, some conductive interconnect structures may comprise metal through-silicon vias (TSVs) or the like, that extend partially or fully through each die or wafer, electrically coupling stacked dies or wafers, sometimes in conjunction with conductive layers or traces. For instance, an example TSV may extend about 50 microns, depending on the thickness of the substrate. In some cases, a stacked die or wafer may include at least two TSVs, including one TSV that electrically connects to the die above and one TSV that electrically connects to the die below. However, if more than 2 or 3 dies are stacked, this scheme can become impractical, as additional TSVs are used for the connections.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

SUMMARY

Figure 1A:
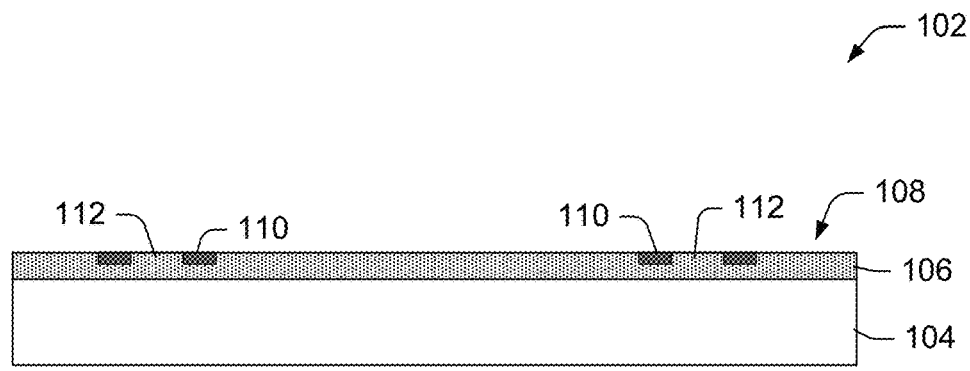
FIG. 1A shows a cross-section of an example substrate having conductive pads with interior areas.

Representative techniques and devices including process steps may be employed to form a common interconnection of a multi-die or multi-wafer stack. Each device of the stack includes a conductive pad disposed at a predetermined relative position on a surface of the device. The devices are stacked to vertically align the conductive pads. A cavity is etched through the devices, and a through-silicon via (TSV) is formed in the cavity that electrically couples the conductive pads of each device of the stack.

In various implementations, the conductive pads may be formed or etched to include an interior area free of conductive material within a perimeter of the pads. The interior area may be formed prior to stacking the devices, which can reduce process steps after stacking. The interior area may have various shapes and/or dimensions to facilitate formation of the TSV and ensure that the TSV contacts all of the desired devices of the stack.

In various examples, the interior area has progressively larger dimensions from the bottom device to the top device of the stack. Alternately or additionally, the interior area may have various shapes, including geometric shapes, irregular shapes, or the like. The various shapes and dimensions of the interior areas can mitigate an overshadowing effect that can result from die placement inaccuracies. An alternate technique for mitigating the overshadowing effect can include an intentional offset of the devices when stacking.

In an embodiment, an example microelectronic assembly comprises a plurality of microelectronic substrates stacked to form a vertical stack. A conductive pad is disposed at a first relative position on a surface of each of the microelectronic substrates. Conductive pads of each of the microelectronic substrates are vertically aligned while the plurality of microelectronic substrates form the vertical stack. A cavity extends through at least all but one of the microelectronic substrates, with the cavity adjacent to a portion of the conductive pad of each of the microelectronic substrates. A conductive material is disposed within the cavity forming a through silicon via (TSV) common to each of the microelectronic substrates of the vertical stack. The TSV comprises an interlayer connection electrically coupled to the conductive pad of each of the microelectronic substrates.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

In various embodiments, techniques and devices may be employed to simplify a common electrical connection of all desired dies and/or wafers in a die-to-die, die-to-wafer, or wafer-to-wafer stack, particularly when more than 2 or 3 dies and/or wafers are stacked. Discussion herein relating to dies also refers to wafers or other substrates in such stacks.

Referring to FIG. 1A (showing a cross-sectional profile view) and FIG. 1B (showing a top view), patterned metal and oxide layers are frequently provided on a die, wafer, or other microelectronic substrate (hereinafter "die 102") as a hybrid bonding, or DBI®, surface layer. A representative device die 102 may be formed using various techniques, to include a base substrate 104 and one or more insulating or dielectric layers 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as an oxide, nitride, oxynitride, oxycarbide, carbides, carbonitrides, diamond, diamond like materials, glasses, ceramics, glass-ceramics, and the like.

Forming a bonding surface 108 includes finishing the surface 108 of the insulating layer 106 to meet dielectric roughness specifications and any metallic layers (e.g., copper traces, structures, pads, etc.) to meet recess specifications, to prepare the surface 108 for direct bonding. In other words, the bonding surface 108 is formed to be as flat and smooth as possible, with very minimal surface topology variance. Various conventional processes, such as chemical mechanical polishing (CMP), dry or wet etching, and so forth, may be used to achieve the low surface roughness. This process provides the flat, smooth surface 108 that results in a reliable bond.

In the case of double-sided dies 102 (not shown), a patterned metal and insulating layer 106 with prepared bonding surfaces 108 may be provided on both sides of the die 102. The insulating layers 106 are typically highly planar (usually to nm-level roughness) with a metal layer (e.g., embedded conductive features) at or recessed just below the bonding surface 108. The amount of recess below the surface 108 of the insulating layer 106 is typically determined by a dimensional tolerance, specification, or physical limitation. The bonding surfaces 108 are often prepared for direct bonding with another die, wafer, or other substrate using a chemical-mechanical polishing (CMP) step and/or other preparation steps.

Figure 1B:
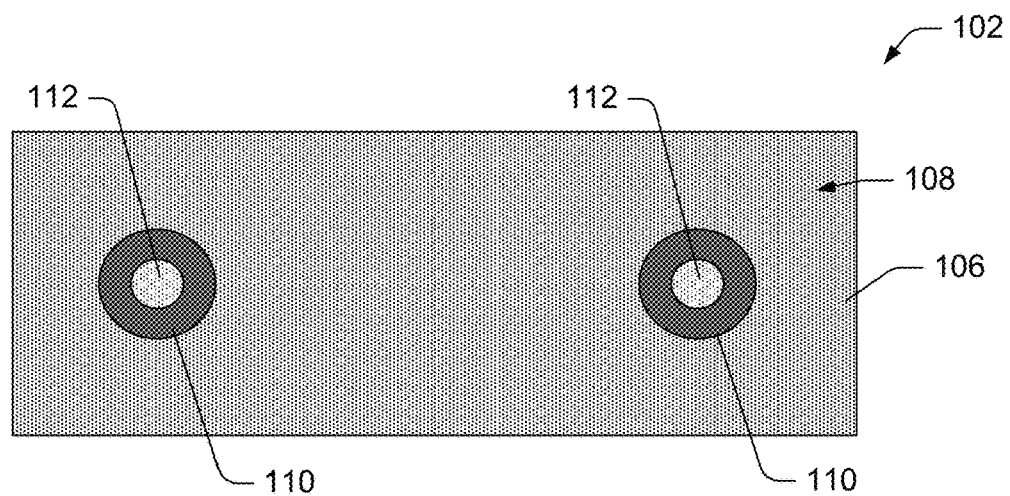
FIG. 1B shows a top view of the example substrate of FIG. 1A.

As shown in FIGS. 1A and 1B, a bonding surface 108 of the device wafer 102 can include conductive pads 110 or other conductive features, such as traces, interconnect structures, or the like, embedded into the insulating layer 106 (e.g., extending partially into the dielectric substrate 106 below the prepared surface 108). The pads 110 may be arranged so that conductive features from other devices can be mated and joined to the pads 110 during bonding, if desired. The joined conductive features can form continuous conductive interconnects (for signals, power, etc.) between stacked devices.

A damascene process (or other processes) may be used to form the pads 110 or other conductive features in the insulating layer 106. For instance, some patterned metal pads 110 or other conductive features may be about 0.5-2 microns thick, and extend below the bonding surface 108. The pads 110 or conductive features may be comprised of metals (e.g., copper, etc.) or other conductive materials, or combinations of materials, and so forth.

In some examples, a barrier layer (not shown) may be deposited in the cavities for the pads 110 prior to depositing the material of the pads 110, such that the barrier layer is disposed between the pads 110 and the insulating layer 106. A barrier layer may be comprised of tantalum, for example, or other conductive materials, to prevent or reduce diffusion of the material of the pads 110 into the insulating layer 106. After the pads 110 are formed, the exposed surface of the device wafer 102, including the insulating layer 106 and the pads 110 or other conductive features can be planarized (e.g., via CMP) to form a flat bonding surface 108.

As shown in FIGS. 1A and 1B, conductive pads 110 may be formed to have an interior area 112 free of conductive material within a perimeter of the pad 110 to accommodate various applications, as further discussed below. For instance, the pads 110 may be formed to have various shapes, such as "O," "U," "C," "G," "D," and other shapes that include an inner area free of conductive material (similar to the interior area 112) and an outer conductive area surrounding the inner interior area (which may partially or fully enclose the inner nonconductive area). In some embodiments, the interior area 112 comprises or exposes an insulating material, such as the insulating layer 106, and in other embodiments, the interior area 112 may comprise a recess, a cavity, an orifice, or other hole partially or fully through the die 102.

Alternately, the pads 110 may be formed without an interior area 112. In some embodiments, pads 110 formed without an interior area 112 may be etched or otherwise processed to have an interior area 112 during manufacture and/or device assembly, as discussed further below.

EXAMPLE EMBODIMENTS

Figure 2:
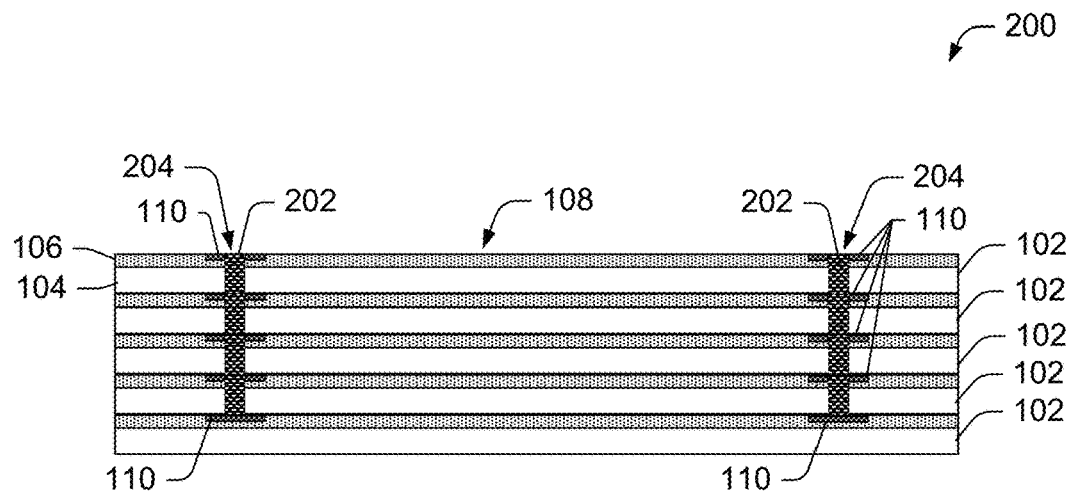
FIG. 2 shows a cross-section of several example bonded substrates having conductive pads with interior areas, and having a TSV formed through the substrates at the interior areas of the conductive pads, according to an embodiment.

Referring to FIG. 2, dies 102 may be stacked and bonded, including direct bonded, for instance, without adhesive to other dies 102 with conductive pads 110. In an embodiment, each of the dies 102 of the stack 200 (e.g., microelectronic assembly) includes a conductive pad 110 disposed at the same relative location on a surface of the die 102. Having the conductive pad 110 at the same location on each die 102 allows the conductive pads 110 on each die 102 to line up vertically when the dies 102 are stacked in a vertical configuration.

When a conductive pad 110 of one die 102 is positioned over a conductive pad 110 of another die 102, a TSV 202 may be formed between the conductive pads 110, with the TSV 202 running through one or both dies 102, electrically coupling conductive pads 110 together. In other words, the TSV 202 may be electrically coupled to the conductive pads 110 on each of the dies 102 that the TSV 202 contacts, forming an electrical connection between the contacted dies 102.

In various implementations, as shown in FIG. 2, a single TSV 202 may be used to connect all of the dies 102 in a stack 200, where the TSV 202 extends to all of the dies 102 in the stack 200. In the implementation, the TSV 202 may or may not extend all the way through the top and/or bottom dies 102 of the stack 200, but may extend through each of the dies 102 between the top and bottom dies 102, and connect to the top and bottom dies 102. The TSV 202 can extend through the top or bottom dies 102 if electrical connection to another microelectronic component is desired at the exterior surface of the top or bottom dies 102, for example.

In one example, the conductive pads 110 are formed of a metal (such as copper or a copper alloy, for instance) on at least one surface of each of the dies 102. When the dies 102 are stacked with the conductive pads 110 aligned, a process can be used to form a cavity 204 through all of the desired dies 102 at the conductive pads 110. In one implementation, the cavity 202 is formed at the interior area 112 of each conductive pad 110 of each die 102. In another implementation where the conductive pads 110 do not have an interior area 112, the cavity 202 is formed at a location within the perimeter of each of the conductive pads 110 as it extends through the dies 102 of the stack 200.

For instance, the process can include alternating a metal etch (to etch an interior area 112 in a metal conductive pad 110, for example), an oxide etch (to etch through the insulating layer 106 of each die 102, for example), and a silicon etch (to etch through the base layer 104 of each die 102, for example) for each of the dies 102 in the stack 200 to form the cavity 204. These steps may be alternated as each die 102 of the stack 200 is etched through. In alternate embodiments, additional etch steps may be used to etch through other layers, if present on one or more of the dies 102. Further, the metal etch may not be needed when an interior area 112 is pre-formed on the conductive pads 110 of the dies 102 of the stack 200.

The cavity 204 can be filled with a conductive material (a metal such as copper, for example) using a deposition process (or other process) to electrically couple all of the dies 102 in the stack 200 with a common TSV 202 (e.g., to form an interlayer electrical connection to all of the dies 102 in the stack 200 with the TSV 202). Note that the conductive pad 110 of the bottom-most die 102 need not be etched to have an interior area 112 to form the interlayer connection. Further, if no electrical connection is desired below the TSV 202, the cavity 204 and TSV 202 need not be extended through the bottom-most die 102. However, if electrical connection is desired below the TSV 202, the cavity 204 and the TSV 202 may be extended to the outer surface of the bottom-most die 102 and the stack 200 (by etching and filling at the bottom-most die 102).

A TSV 202 may comprise a conductive material such as a metal (e.g., copper) or the like, and extend normal to the bonding surface 108 of each die, partly or fully through one or more dies 102 (depending on which dies 102 of the stack 200 are desired to be electrically coupled at the interlayer connection node of the TSV 202). For instance, a TSV 202 may extend about 50 microns through a die 102, depending on the thickness of the die 102.

In various embodiments, as shown at FIG. 1B for example, the conductive pad 110 may be pre-patterned on one or more of the dies 102 prior to stacking to reduce process steps in forming the interlayer connection (e.g., the TSV 202). For instance, each of the conductive pads 110 may be pre-patterned (formed or etched) with an interior area 112 free of conductive material, having a predetermined size, shape, etc. to eliminate the metal etch portion of the process after the dies 102 are stacked. When the conductive pad 110 is pre-formed with a nonconductive portion 112 at an interior portion of the pad 110, the oxide 106 and silicon 104 layers of the dies 102 can be etched within the interior area 112 (at the interior portion of the conductive pad 110 and directly adjacent to a conductive portion of the conductive pad 110) to form the cavity 204 after the dies 102 are stacked.

When the cavity 204 is filled with conductive material (e.g., metal), the conductive material contacts each of the conductive pads 110 at each of the stacked dies 102 to form the interlayer connection (e.g., the TSV 202). In various implementations, the conductive pads 110 may be formed (deposited or etched) in the shape of an "O," a "C," a "U," a "G," a "D," or any geometric or preselected shape with an interior open area (e.g., opening 112). In one example, the width or diameter of the interior nonconductive area 112 is approximately 5 to 10 microns. In some embodiments, the conductive pad 110 of the bottom-most die 102 may or may not be formed with the interior area 112 as there may not be a need to connect pad 110 to the other side of die 102.

Figure 3:
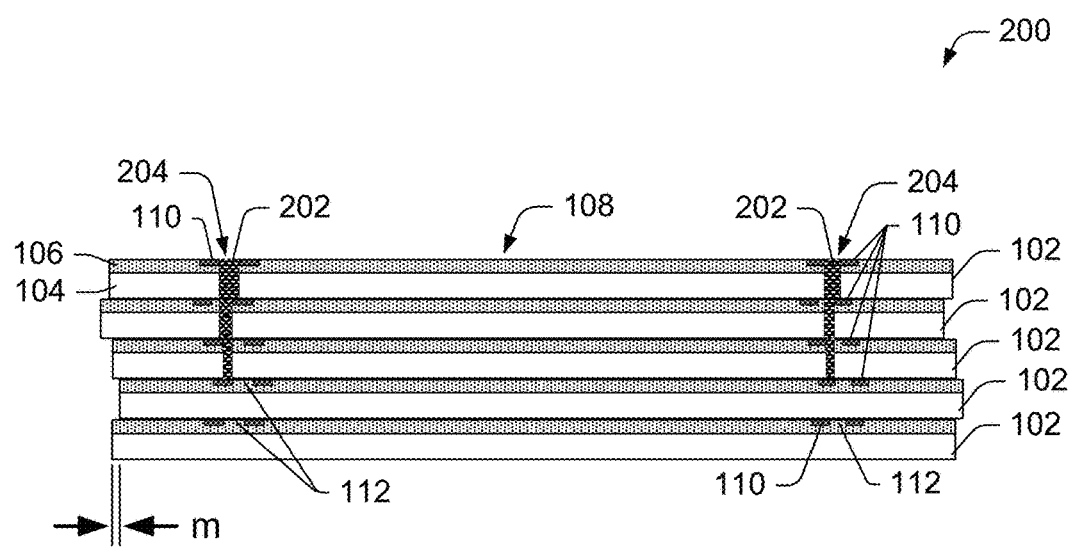
FIG. 3 shows a cross-section of several example misaligned bonded substrates having conductive pads with interior areas, and having a TSV formed through some of the substrates at the interior areas of the conductive pads.

In another embodiment, the size of the conductive pads 110 and/or the size of the interior area 112 of each of the conductive pads 110 on various dies 102 of the stack 200 may not be uniform. Such a non-uniform sizing arrangement can allow for the cavity 204 to be etched through to the conductive pad 110 of the bottom-most die 102, while accounting for random misalignments between the stacked dies 102. For instance, while FIG. 2 represents a die stack 200 with an ideal die 102 placement, perfectly aligned dies 102 may not be practical or likely in a high volume manufacturing setting. FIG. 3 shows a die stack 200 that may be more likely, with an average misalignment between dies 102 of "m."

As shown in FIG. 3, random misalignments of the dies 102 (based on error of die 102 placement during stacking) can cause the metallic portions of pre-patterned conductive pads 110 to overlap or overshadow the interior areas 112 (including the insulating layer 106 and silicon base layer 104) on lower dies 102 in the stack 200. This can be an issue when the conductive pads 110 and the interior areas 112 are uniform or close to uniform among each of the dies 102. The overshadowing can result in the lower dies 102 being missed during oxide and silicon etching steps. In that case, the cavity 204 and the resulting TSV 202 may not extend to the "missed" dies 102, which can prevent their inclusion with the interlayer connection. This "missed die" effect can be worse with a greater number of dies 102 in the stack 200, since the likelihood of missed dies 102 at the bottom of the stack 200 may increase with additional misaligned dies 102.

Figure 4A:
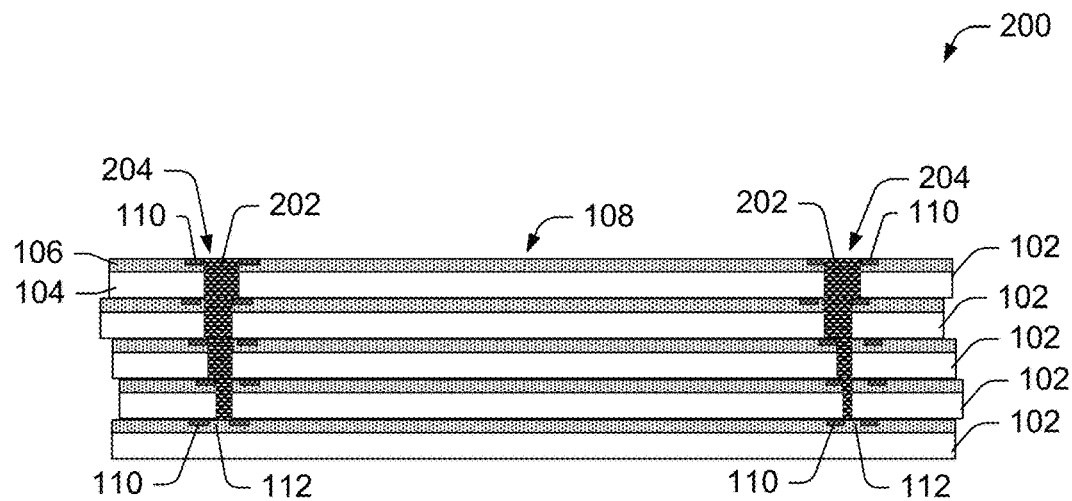
FIG. 4A shows a cross-section of several example bonded substrates having conductive pads with interior areas, and having a TSV formed through the substrates at the interior areas of the conductive pads, according to various embodiments.

In various embodiments, forming the conductive pads 110 and/or the interior areas 112 in a non-uniform arrangement can mitigate the "missed die" effect in the stack 200 by reducing overshadowing. For instance, in an embodiment as shown in FIG. 4A, the conductive pads 110 are formed and the dies 102 are stacked such that the interior areas 112 of the conductive pads 110 becomes increasingly larger with each die 102, progressing from the bottom die 102 (or the second from the bottom die 102) to the top die 102 of the stack 200.

In the embodiment, a predetermined incremental up-sizing of the interior areas 112 of the conductive pads 110 can be arranged to be greater than the potential error of misalignment "m." As a result, any overlapping or overshadowing of the lower conductive pads 110 by the upper conductive pads 110 is not a total overshadowing of the interior areas 112 of the lower conductive pads 110, and is not enough to prevent the interior areas 112 of the lower dies 102 from being etched to form the cavity 204 in the lower dies 102 (including the second to last die 102 and/or the bottom-most die 102 if desired). Thus, there are no "missed dies 102" in the stack 200 since the cavity 204 and the resulting TSV 202 are extended to the second to last die 102 and/or the bottom-most die 102, if desired.

Figures 4B, 4C:
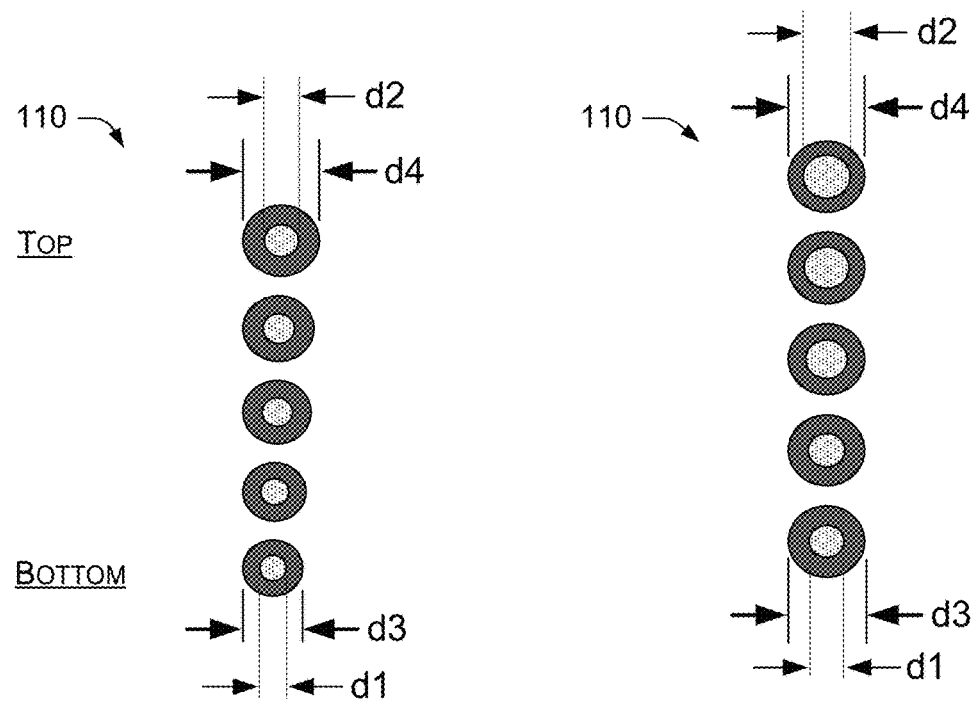
FIG. 4B shows a top view of example conductive pads with interior areas, the conductive pads increasing in diameter, according to an embodiment.
FIG. 4C shows a top view of example conductive pads with interior areas, the interior areas of the conductive pads increasing in diameter, according to an embodiment.

As an example, FIGS. 4B and 4C each show a set of conductive pads 110 in an order that the pads 110 may be arranged in a die stack 200, according to an implementation. Note that in the die stack 200, the conductive pads 110 would be arranged over one another, as shown in FIG. 4A. As shown in FIGS. 4B and 4C, the inner interior areas 112 become increasingly larger in diameter, from a diameter "d1" at the bottom-most pad 110 to a diameter "d2" at the top pad 110 (where d1<d2).

As shown in FIG. 4B, the overall diameter of the conductive pads 110 may also increase, from a diameter "d3" at the bottom-most pad 110 to a diameter "d4" at the top pad 110 (where d3<d4). Increasing the overall diameter of the conductive pads 110 can allow the conductive outer "ring" of the pads 110 to have the same or a similar thickness (e.g., d3−d1=d4−d2) if desired. Otherwise, as shown in FIG. 4C, the outer diameter of the conductive pads 110 may be uniform (where d3=d4). In some cases, having the outer diameter of the conductive pads 110 be uniform can simplify manufacturing.

Figure 5:
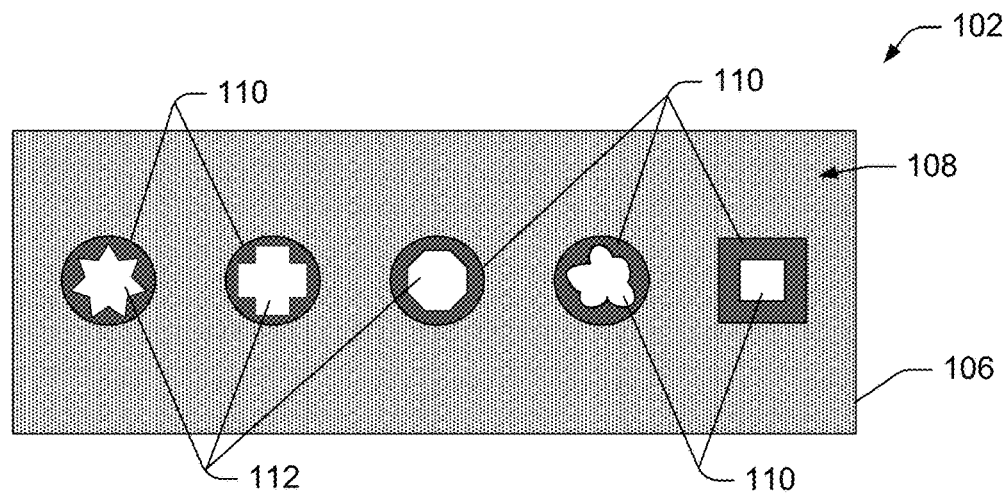
FIG. 5 shows a top view of an example die or wafer, with various conductive pads having interior areas of different shapes, according to various embodiments.

Referring to FIG. 5, in another embodiment, the interior areas 112 of conductive pads 110 can be formed to have a predetermined pattern or shape. Based on the pattern or shape selected, stacking the patterned conductive pads 110 can avoid a total overshadow effect on the interior areas 112 at lower dies 102 in the stack 200 (due to random misalignments), even when the pattern is uniform on each of the dies 102 of the stack 200 (for a given cavity 204 and TSV 202).

The example conductive pads 110 of FIG. 5 show some non-limiting example patterns and shapes for interior areas 112. In various implementations, the pattern or shape of the interior areas 112 of the conductive pads 110 can include polygons, geometric shapes, eccentric or irregular shapes, multi-faceted shapes, and so forth. In some implementations, the overall shape of the conductive pad 110 may also include polygons, geometric shapes, eccentric or irregular shapes, multi-faceted shapes, and so forth. In various implementations, the size, pattern, and shape of the areas 112 may be selected for a highest probability of success (e.g., full interlayer electrical connection without etching conductive pads), in light of die 102 placement accuracy.

Figure 6:
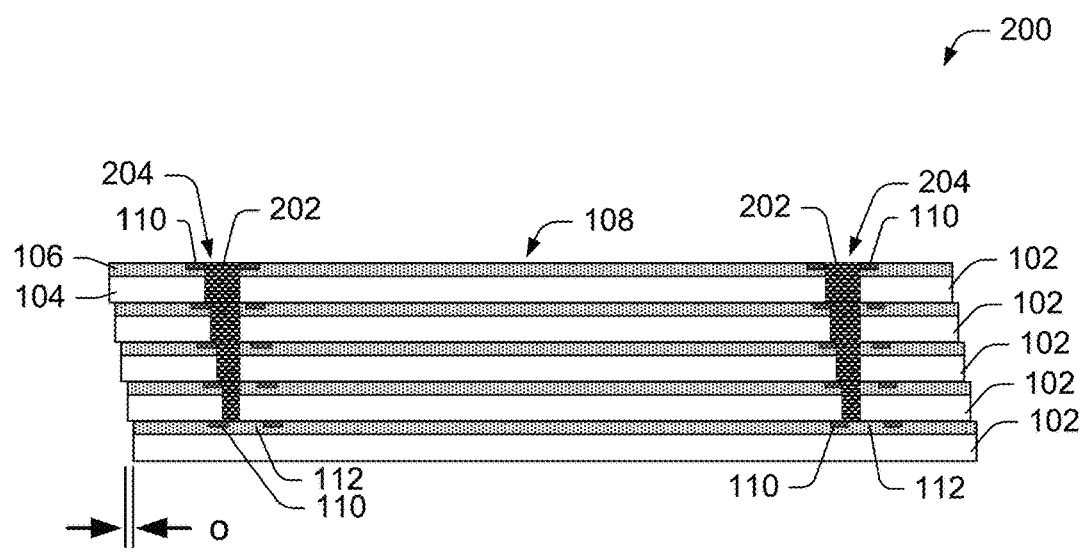
FIG. 6 shows a cross-section of several example bonded substrates having conductive pads with interior areas, and having a TSV formed through the substrates at the interior areas of the conductive pads, according to an embodiment.

Referring to FIG. 6, in a further embodiment, the effects of overshadowing can be mitigated by an intentional predetermined offset in the placement of the dies 102 on the stack 200. In the embodiment, the sizing and shape of the interior areas 112 as well as the overall diameter and shape of the conductive pads 110 can be as discussed above with regard to any of FIGS. 1B, 4B, 4C, and 5. As shown at FIG. 6, the conductive pads 110 and interior areas 112 may be uniform in size and shape for each of the dies 102 in the stack 200. In the embodiment, the dies 102 are stacked with a predetermined offset "o."

As shown at FIG. 6, a stacking arrangement with an intentional offset can allow for the cavity 204 to be etched through to the conductive pad 110 of the bottom die 102 of the stack 200, while accounting for random misalignments between the stacked dies 102. In an embodiment, each die 102 added to the stack is offset in a predetermined direction and to a predetermined extent "o." For example, each die 102 may be intentionally offset 0.5 microns in a 180 degree direction (for instance).

In the embodiment, the intentional offset "o" is selected to be slightly larger than the average error of placement "m" by the die placement tools. The cumulative effect of the intentional offsets "o" results in reduced overshadowing of areas 112 on lower dies 102 and therefore a high likelihood that the cavity 204 will extend to the conductive pad 110 of the bottom-most die 102 when the insulating layer 106 and silicon base layer 104 of the stacked dies 102 are etched (e.g., without etching any of the conductive pads 110).

In alternative embodiments, the sizing and shape of the interior areas 112 of the conductive pads 110 and the arrangement of the dies 102 may have alternate configurations to account for the random misalignments. Further, any combination of the disclosed techniques may be employed together to account for the random misalignments.

Example Process

Figure 7:
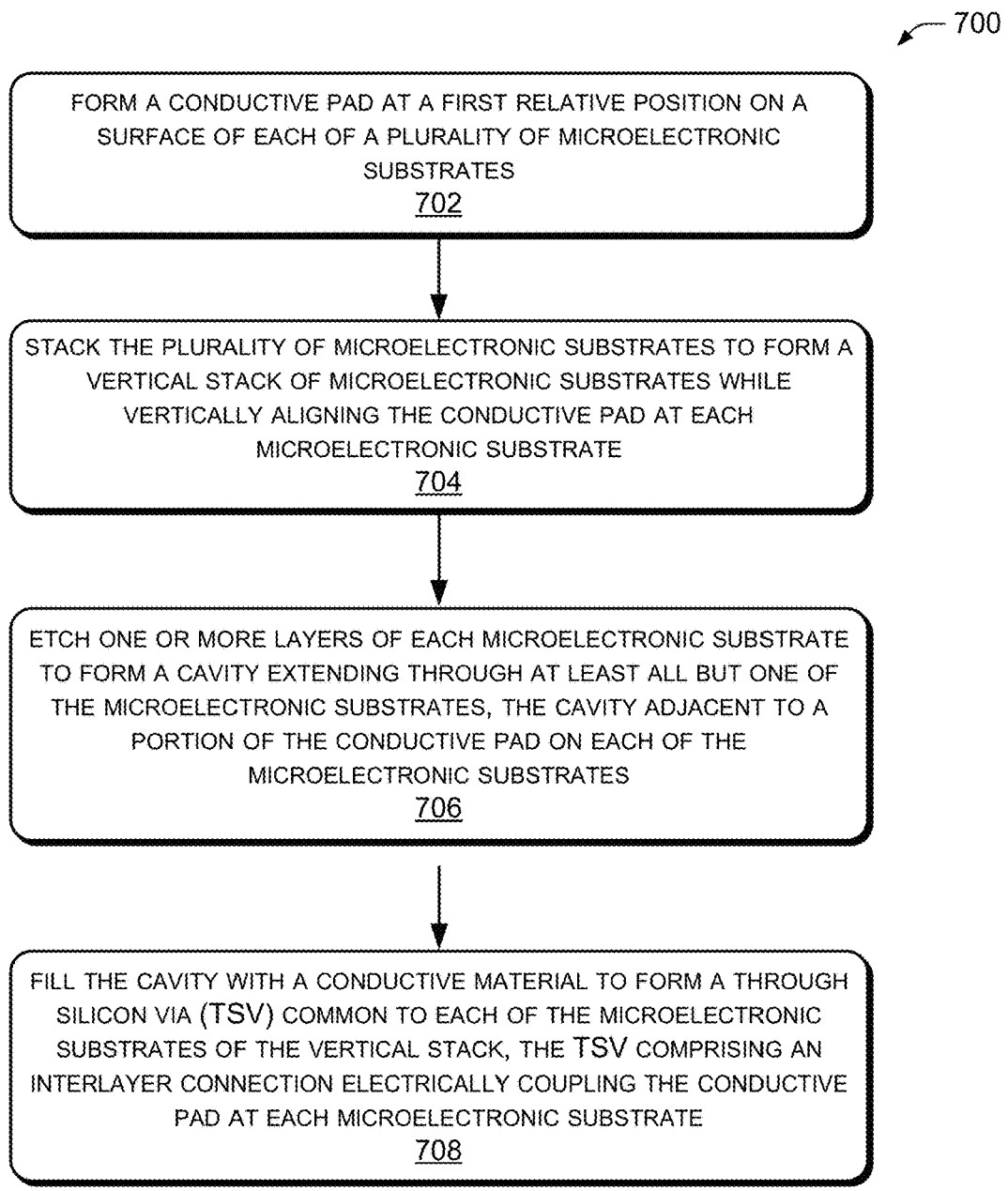
FIG. 7 is a text flow diagram illustrating an example process of forming a common interconnection of a multi-die or multi-wafer stack, according to an embodiment.

FIG. 7 illustrates a representative process 700 of forming a common interconnection of a multi-die or multi-wafer stack (such as stack 200, for example), according to various embodiments. For instance, a through-silicon via (TSV) may be formed in a cavity disposed through each of the dies of the stack, at similarly situated contact pads at each of the dies. The TSV comprises an interlayer connection that electrically couples the similarly situated contact pads at each of the dies. The process refers to FIGS. 1-6.

The order in which the process is described is not intended to be construed as limiting, and any number of the described process blocks in the process can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein. In alternate implementations, other techniques may be included in the process in various combinations and remain within the scope of the disclosure.

In an implementation, at block 702, the process 700 includes forming a conductive pad (such as conductive pad 110, for example) at a first relative position on a surface of each of a plurality of microelectronic substrates (such as dies 102, for example).

In an implementation, the process includes forming the conductive pad on the surface of at least all but one of the microelectronic substrates to include an interior area free of the conductive material of the conductive pad.

In an implementation, the process includes forming the interior area of the conductive pad of each microelectronic substrate of the stack to have a different maximum dimension. In one embodiment, the process includes forming the interior area of the conductive pad of each subsequent microelectronic substrate of the stack to have a larger maximum dimension than a maximum dimension of the interior area of the conductive pad of a previously placed microelectronic substrate.

In an implementation, the process includes patterning the conductive pad to have an "O," a "C," a "D," a "G," or a "U" shape.

In one example, the process includes patterning an exterior perimeter of the conductive pad to have a first predetermined size and shape and patterning the interior portion of the conductive pad to have a second predetermined size and shape. In one implementation, the process includes forming the second predetermined size and shape to comprise a polygon, a geometric shape, an eccentric shape, an irregular shape, or a multi-faceted shape.

At block 704, the process includes stacking the plurality of microelectronic substrates to form a vertical stack of microelectronic substrates while vertically aligning the conductive pad at each microelectronic substrate. In some embodiments, the microelectronic substrates (which may be thicker prior to bonding) may be thinned as desired after bonding. For instance, each microelectronic substrate may be thinned after bonding the microelectronic substrate to another microelectronic substrate or to the stack.

At block 706, the process includes etching one or more layers of at least all but one of the microelectronic substrates to form a cavity extending through the at least all but one of the microelectronic substrates. In the implementation, the cavity is adjacent to a portion of the conductive pad on each of the microelectronic substrates. In one example, the process includes forming the cavity within the interior or open area of the conductive pad. In another implementation, the process includes reducing at least one iterative etching step to form the cavity due to forming the conductive pad on the surface of each of the plurality of microelectronic substrates to include the open area.

At block 708, the process includes filling the cavity with a conductive material to form a through silicon via (TSV) common to each of the microelectronic substrates of the vertical stack. In the implementation, the TSV comprises an interlayer connection electrically coupling the conductive pad at each microelectronic substrate.

In an implementation, the process includes bonding the plurality of microelectronic substrates in the stack to each other using an ambient temperature direct bonding technique without adhesives prior to forming the cavity.

In an implementation, a size of the interior area of the conductive pad is not uniform throughout the microelectronic substrates. In one example, the size of the interior area of the conductive pads progressively increases with each of the microelectronic substrates of the stack, from a microelectronic substrate at a bottom of the stack to a microelectronic substrate at a top of the stack.

In an implementation, the process includes forming the vertical stack by intentionally offsetting each subsequent microelectronic substrate a predetermined distance in a first offset direction relative to a previously placed microelectronic substrate. In one example, the predetermined distance is larger than an average die placement error of die placement tools used to stack the plurality of microelectronic substrates to form the vertical stack.

In an implementation, the microelectronic substrates may each be thinned from the side opposite the conductive pad to reduce the extent to which the TSV must extend. Such thinning may be done as each microelectronic substrate is stacked on the previous die or support substrate. Moreover, while the microelectronic substrates are shown stacked with a face-to-back orientation, the microelectronic substrates may be placed in a face-to-face or back-to-back orientation.

In various embodiments, some process steps may be modified or eliminated, in comparison to the process steps described herein.

The techniques, components, and devices described herein are not limited to the illustrations of FIGS. 1-7, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method of forming a microelectronic assembly, comprising:
    forming a conductive pad at a first relative position on a surface of each of a plurality of microelectronic substrates, the conductive pad on the surface of at least all but one of the plurality of microelectronic substrates including an interior area free of conductive material, the plurality of microelectronic substrates comprising at least three microelectronic substrates;
    direct bonding the plurality of microelectronic substrates to form a vertical stack of microelectronic substrates while vertically aligning at least a portion of the conductive pad on the surface of each of the plurality of microelectronic substrates, including intentionally offsetting the conductive pad on the surface of each subsequent microelectronic substrate of the plurality of microelectronic substrates a predetermined distance relate to the conductive pad on the surface of a previously placed microelectronic substrate of the plurality of microelectronic substrates;
    etching one or more layers of the at least all but one of the plurality of microelectronic substrates in the vertical stack of microelectronic substrates to form a cavity extending through the at least all but one of the plurality of microelectronic substrates, the cavity adjacent to a portion of the conductive pad on each of the microelectronic substrates and extending through the interior area of the conductive pad of the at least all but one of the plurality of microelectronic substrates; and
    filling the cavity with a conductive material to form a through silicon via (TSV) common to each of the plurality of microelectronic substrates of the vertical stack of microelectronic substrates, the TSV comprising an interlayer connection electrically coupling the conductive pad on the surface of each of the plurality of microelectronic substrates.

2. The method of forming a microelectronic assembly of claim 1, further comprising patterning an exterior perimeter of the conductive pad on the surface of each of the plurality of microelectronic substrates to have a first predetermined size and shape and patterning the interior portion of the conductive pad on the surface of the at least all but one of the microelectronic substrates to have a second predetermined size and shape.

3. The method of forming a microelectronic assembly of claim 2, further comprising patterning the conductive pad on the surface of the at least all but one of the microelectronic substrates to have a "C," a "D," a "G," or a "U" shape.

4. The method of forming a microelectronic assembly of claim 2, wherein the second predetermined size and shape comprises a polygon, a geometric shape, an eccentric shape, an irregular shape, or a multi-faceted shape.

5. The method of forming a microelectronic assembly of claim 1, wherein the number of iterative etching steps to form the cavity is reduced by forming the conductive pad on the surface of each of the plurality of microelectronic substrates to include the interior area.

6. The method of forming a microelectronic assembly of claim 1, wherein a size of the interior area of the conductive pad on the surface of the at least all but one of the microelectronic substrates is not uniform throughout the microelectronic substrates.

7. The method of forming a microelectronic assembly of claim 6, wherein a size of the interior area of the conductive pad on the surface of the at least all but one of the microelectronic substrates progressively increases with each of the microelectronic substrates of the stack, from a microelectronic substrate at a bottom of the stack to a microelectronic substrate at a top of the stack.

8. The method of forming a microelectronic assembly of claim 1, wherein the intentionally offsetting each subsequent microelectronic substrate the predetermined distance is in a first offset direction relative to the previously placed microelectronic substrate.

9. The method of forming a microelectronic assembly of claim 8, wherein the predetermined distance is larger than an average die placement error of die placement tools used to stack the plurality of microelectronic substrates to form the vertical stack.

10. The method of forming a microelectronic assembly of claim 1, wherein the direct bonding the plurality of microelectronic substrates is carried out using an ambient temperature direct bonding technique without adhesives prior to forming the cavity.

11. A method of forming a microelectronic assembly, comprising:
    forming a conductive pad at a first relative position on a surface of each of a plurality of microelectronic substrates, the conductive pad on the surface of each of the plurality of microelectronic substrates including an interior area free of conductive material, and the plurality comprising at least three microelectronic substrates;
    stacking the plurality of microelectronic substrates to form a vertical stack of microelectronic substrates while vertically aligning at least a portion of the conductive pad on the surface of each of the plurality of microelectronic substrates, including intentionally offsetting the conductive pad on the surface of each subsequent microelectronic substrate of the plurality of microelectronic substrates a predetermined distance relative to the conductive pad on the surface of a previously placed microelectronic substrate of the plurality of microelectronic substrates;
    etching one or more layers of at least all but one of the plurality of microelectronic substrates in the vertical stack of microelectronic substrates to form a cavity extending through at least all but one of the plurality of microelectronic substrates, the cavity adjacent to a portion of the conductive pad on the surface of the at least all but one of the plurality of microelectronic substrates and extending through the interior area of the conductive pad of the at least all but one of the plurality of microelectronic substrates; and filling the cavity with a conductive material to form a through silicon via (TSV) common to each of the plurality of microelectronic substrates of the vertical stack of microelectronic substrates, the TSV comprising an interlayer connection electrically coupling the conductive pad on the surface of each of the plurality of microelectronic substrates.

12. The method of forming a microelectronic assembly of claim 11, further comprising forming the interior area of the conductive pad of each microelectronic substrate of the stack to have a different maximum dimension.

13. The method of forming a microelectronic assembly of claim 11, further comprising forming the interior area of the conductive pad of each subsequent microelectronic substrate of the plurality of microelectronic substrates of the stack to have a larger maximum dimension than a maximum dimension of the interior area of the conductive pad of a previously placed microelectronic substrate of the plurality of microelectronic substrates.

14. The method of forming a microelectronic assembly of claim 11, further comprising forming the interior area of the conductive pad of each of the plurality of microelectronic substrate of the stack to have a predetermined size and shape comprising a polygon, a geometric shape, an eccentric shape, an irregular shape, or a multi-faceted shape.

\* \* \* \* \*